US009861002B1

(12) United States Patent
Tenorio

(10) Patent No.: US 9,861,002 B1
(45) Date of Patent: Jan. 2, 2018

(54) SINGLE CHANNEL I/O IN A MODULAR SUB-CHASSIS

(71) Applicant: Rockwell Automation Technologies, Inc., Mayfield Heights, OH (US)

(72) Inventor: Terence S. Tenorio, Solon, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/298,772

(22) Filed: Oct. 20, 2016

(51) Int. Cl.
*H05K 5/02* (2006.01)
*H05K 5/00* (2006.01)
*H05K 7/14* (2006.01)
*G06F 13/40* (2006.01)

(52) U.S. Cl.
CPC ....... *H05K 5/0286* (2013.01); *G06F 13/4068* (2013.01); *H05K 5/0021* (2013.01); *H05K 7/1418* (2013.01); *H05K 7/1439* (2013.01)

(58) Field of Classification Search
CPC combination set(s) only.
See application file for complete search history.

(56) References Cited

U.S. PATENT DOCUMENTS

| 6,049,449 | A | * | 4/2000 | Cranston, III | .......... | G06F 1/184 361/679.58 |
| 6,241,530 | B1 | * | 6/2001 | Eddy | ........................ | H05K 1/14 361/788 |
| 6,300,847 | B1 | * | 10/2001 | Gallagher | ............... | G06F 1/189 333/246 |
| 6,419,499 | B1 | * | 7/2002 | Bundza | ................ | H05K 7/1451 439/377 |
| 7,412,548 | B2 | | 8/2008 | Sichner | | |
| 7,525,809 | B2 | * | 4/2009 | Bergmann | .......... | H01R 25/006 361/752 |

(Continued)

OTHER PUBLICATIONS

TURCK pamphlet titled *Stainless Steel Junction Box Connects up to Eight Signals in Harsh Process Environments*, Sep. 9, 2013.

(Continued)

*Primary Examiner* — Lisa Lea Edmonds
(74) *Attorney, Agent, or Firm* — Fay Sharpe LLP

(57) ABSTRACT

An industrial automation input/output (I/O) module includes a body defining an internal space including a plurality of slots. A module backplane connector is connected to the body, and a primary backplane interface circuit board is located in the space of the body. The primary backplane interface circuit board is electrically connected to the module backplane connector and includes electronic devices configured to transmit data and power to and from an associated backplane circuit through the module backplane connector. A plurality of individual I/O circuit boards are installed respectively in the plurality of slots of the body. Each of the I/O circuit boards includes electronic devices configured to provide a single-channel I/O circuit for input or output of data with respect to an associated field device. Each of the I/O circuit boards is electrically connected to the primary backplane interface circuit board when installed in a respective one of said slots, and each of the plurality of I/O circuit boards is selectively removable from its respective slot and from the internal space of the body for selective electrical disconnection of said I/O circuit board from the primary backplane interface circuit board.

20 Claims, 4 Drawing Sheets

(56) References Cited

U.S. PATENT DOCUMENTS

| | | | |
|---|---|---|---|
| 7,581,053 B2 | 8/2009 | Sichner et al. | |
| 9,411,769 B2 | 8/2016 | Erni et al. | |
| 9,459,595 B2 * | 10/2016 | Chin | H05K 7/1465 |
| 2001/0011314 A1 * | 8/2001 | Gallagher | G06F 9/4406 |
| | | | 710/302 |
| 2002/0181194 A1 * | 12/2002 | Ho | G06F 1/1616 |
| | | | 361/679.21 |
| 2007/0245165 A1 * | 10/2007 | Fung | G06F 1/32 |
| | | | 713/320 |
| 2010/0172077 A1 * | 7/2010 | Randall | H05K 7/1492 |
| | | | 361/679.4 |
| 2015/0092788 A1 * | 4/2015 | Kennedy | G06F 1/185 |
| | | | 370/419 |

OTHER PUBLICATIONS

Allen-Bradley document titled *Selection Guide ControlLogix System 1756 Series Catalog Numbers*, Publication 1756-SG001T-EN-P, Oct. 2015.

Deltav Whitepaper, pamphlet titled *Electronic Marshalling Overview*, Jan. 2013.

\* cited by examiner

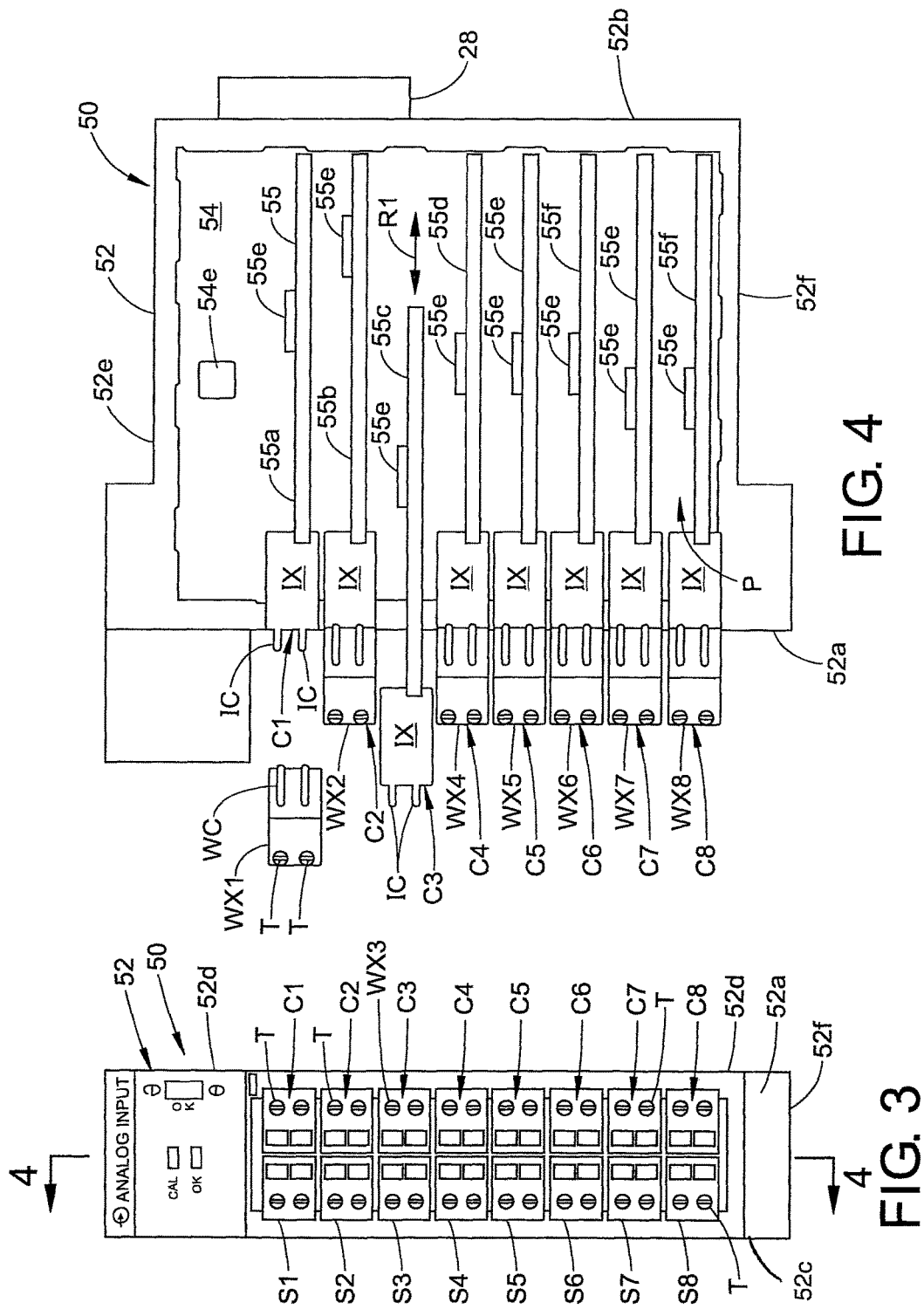

SINGLE CHANNEL I/O IN A MODULAR SUB-CHASSIS

FIELD

The present development relates to industrial automation control systems and, more particularly, to an input/output (I/O) module of such a system including a plurality of single channel I/O subsystems installed in a modular sub-chassis such that individual I/O channels can be installed and removed as desired while leaving all other I/O channels of the module unaffected.

BACKGROUND INFORMATION

FIG. 1 shows a first example of an industrial control system CS including an industrial automation controller 100 and a distributed industrial automation input/output (I/O) system 10 operatively connected to the industrial controller. The I/O system 10 includes a network adapter module 12 providing a connection 14 to an industrial data network 16. The data network 16 may be any one of a number of industrial control or I/O networks including but not limited to ControlNet, DeviceNet, EtherNet/IP, RIO, ASi, PROFIBUS, PROHnet, Foundation Fieldbus or the like as are well known in the art of industrial automation data networks. The adapter module 12 communicates over the network 16 with the industrial controller 100 to receive output data from the industrial controller or to provide input data to the industrial controller 100 to be processed according to a control program executed by a PLC and/or other processor(s) of the industrial controller 100. The network 16 can be hard-wired or wireless.

With respect to the I/O system, itself, the adapter module 12 communicates with a backplane circuit B (often referred to simply as the "backplane") to operably connect the industrial controller 100 to one or more I/O modules 20 that are operably connected to the backplane B. In the illustrated embodiment, a physical base or chassis 18 is provided to contain the adapter module 12 and to contain the I/O modules 20. At least the I/O modules 20, and optionally also the adapter module 12, are selectively insertable and removable to/from the chassis 18 to provide the modularity required for customization, module repair/replacement, expansion capability, and the like.

The I/O modules 20 connect via I/O field lines 24 (e.g., electrical cables, fiber optic cables, etc.) with a controlled device or process 26a,26b,26c,etc. (generally 26) which can be a machine, a sensor, or another device or process, or several or portions of same. As is understood in the art, the I/O modules 20 convert digital data received over the backplane B from the controller 100 and adapter module 12 into output signals (either digital or analog) in a form suitable for input to an industrial process 26. The I/O modules 20 typically also receive digital or analog signals from an industrial process 26 and convert same to digital data suitable for transmission on the backplane B to the adapter module 12 and, thereafter, to the controller 100 for processing.

FIG. 2 is similar to FIG. 1 but shows an alternative industrial automation control system CS' in which the industrial controller 100 is also mechanically connected to the chassis 18 and directly operably connected to the backplane B for communication of data to and from the I/O modules 20, in which case the adapter module 12 is eliminated. In such case, the industrial controller 100 and the I/O modules 20 communicate with each other directly over the backplane circuit B.

In either the example of FIG. 1 or FIG. 2, modularity of the I/O modules 20 with respect to the chassis 18 and backplane B is provided through an electrical module connector 28 on each I/O module 20 which may be mated with any one of a number of corresponding electrical backplane connectors 30 extending from and operatively connected to the backplane B. The backplane connectors 30 are each associated with a respective physical and logical module mounting location or "slot," and the chassis 18 provides mechanical features (not shown) associated with each slot for mechanically releasably securing each I/O module 20 to the chassis 18 in its operative position.

Furthermore, for both of the above-described systems CS,CS' of FIGS. 1 and 2, each I/O module 20, itself, includes multiple I/O communications channels 22a,22b, 22c,etc. (generally 22), such that each I/O module 20 can be operably connected to communicate with a corresponding multiple number of field devices or processes 26. One deficiency of known systems is that the I/O channels 22 of each module 20 are manufactured with a select type (analog or digital, input or output) that cannot be altered after the module 20 is manufactured and that cannot be customized for a particular user's requirements. This limitation often requires that an end-user purchase more modules 20 than desired in order to have the required types of I/O channels for a particular application, even though certain I/O channels (of the type not needed for that particular application) are not being used. Another drawback associated with known systems is that a failure of one of the I/O channels 22a,22b,22c in a particular I/O module 20 requires that the entire I/O module 20 be removed and replaced, even though only one of the channels 22 of the module has failed. This is highly undesirable because replacement of an I/O module 20 for failure of a single channel 22 of the module creates a significant expense for replacement of the complete I/O module. Also, every device or process 26 connected to not only the faulty I/O channel 22 but also the properly functioning I/O channels 22 of the module 20 must be stopped and disconnected from the I/O module 20 until a replacement module 20 is installed, which typically also requires associated devices and processes 26 being controlled to be stopped until the I/O module 20 with the defective I/O channel 22 is replaced.

SUMMARY

In accordance with one aspect of the present development, an industrial automation input/output (I/O) module includes a body defining an internal space including a plurality of slots. A module backplane connector is connected to the body, and a primary backplane interface circuit board is located in the space of the body. The primary backplane interface circuit board is electrically connected to the module backplane connector and includes electronic devices configured to transmit data and power to and from an associated backplane circuit through the module backplane connector. A plurality of individual I/O circuit boards are installed respectively in the plurality of slots of the body. Each of the I/O circuit boards includes electronic devices configured to provide a single-channel I/O circuit for input or output of data with respect to an associated field device. Each of the I/O circuit boards is electrically connected to the primary backplane interface circuit board when installed in a respective one of said slots, and each of the plurality of I/O circuit boards is selectively removable from its respective slot and from the internal space of the body for selective electrical disconnection of said I/O circuit board from the primary backplane interface circuit board.

In accordance with another aspect of the present development, an industrial automation control system includes an industrial automation controller and a plurality of input/output (I/O) modules operatively connected to the industrial automation controller through an industrial data network. The I/O modules are operatively connected to a chassis comprising a backplane circuit. The I/O modules each include a body defining an internal space including a plurality of slots. A module backplane connector is connected to the body for operative electrical connection with the backplane circuit. A primary backplane interface circuit board is located in the space of the body. The primary backplane interface circuit board is electrically connected to the module backplane connector and includes electronic devices configured to transmit data and power to and from the backplane circuit through the module backplane connector. A plurality of individual single-channel I/O circuit boards are installed respectively in the plurality of slots of the body. Each of the I/O circuit boards includes electronic devices configured to provide a single-channel I/O circuit for input or output of data with respect to an associated field device or process. Each of said single-channel I/O circuit boards is operatively electrically connected to the primary backplane interface circuit board when installed in a respective one of said slots, and each of the plurality of I/O circuit boards is selectively removable from its respective slot and from the internal space of the body for selective electrical disconnection of said I/O circuit board from the primary backplane interface circuit board.

BRIEF DESCRIPTION OF THE DRAWINGS

FIG. 3 is a front elevation view of an I/O module provided in accordance with the present development and comprising single channel I/O in a modular sub-chassis;

FIG. 4 is a section view of the I/O module of FIG. 3 as taken at line 4-4 of FIG. 3;

DETAILED DESCRIPTION

Figure 1:
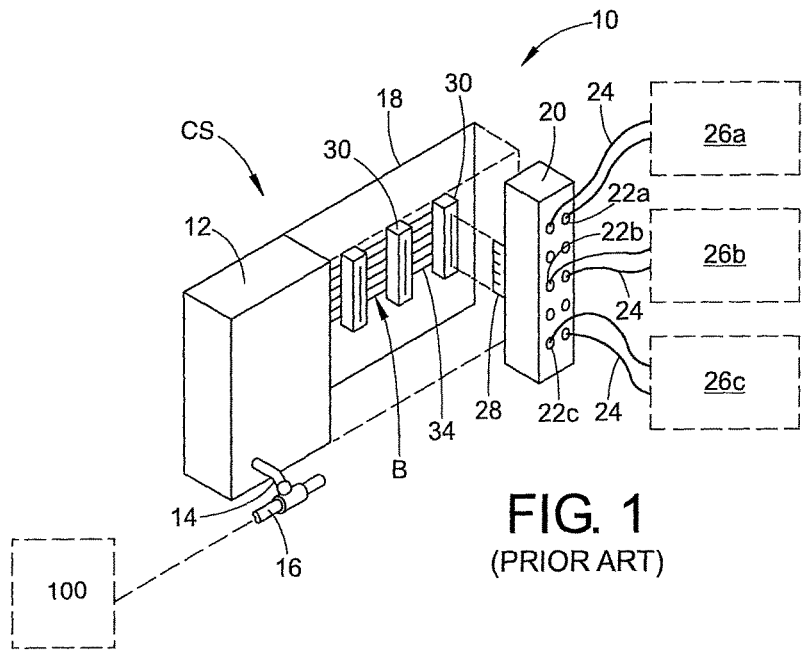
FIG. 1 shows a first example of a known industrial control system including an industrial automation controller and a distributed industrial automation input/output (I/O) system.

FIG. 3 is a front elevation view of an I/O module 50 provided in accordance with the present development and comprising a modular sub-chassis for insertion and removal of individual single I/O channel subsystems or channels C1-C8. FIG. 4 is a section view of the I/O module of FIG. 3 as taken at line 4-4 of FIG. 3. The I/O module 50 is adapted to be physically connected to the base or chassis 18 of FIG. 1 or FIG. 2. The I/O module 50 comprises an electrical module backplane connector 28 adapted to be operably connected to the electrical backplane connector 30 of the chassis 18 to operably connect the module 50 to the backplane B for communication of power and data between the module 50 and backplane 18.

In FIGS. 3 and 4, it can be seen that the module 50 comprises a housing or body 52 including a front wall 52a, a rear wall 52b, left and right side walls 52c,52d, a top wall 52e, and a bottom wall 52f. In the illustrated example, the front and rear walls 52a,52b are parallel and spaced-apart from each other, the left and right side walls 52c,52d are parallel and spaced-apart from each other and extend between the front and rear walls, and the top and bottom walls 52e,52f are parallel and spaced-part from each other and extend between the left and right side walls 52c,52d. The body 52 thus defines an internal space P for containing a primary backplane interface circuit board 54 (also sometimes referred to as the "primary board" or "motherboard") and a plurality of single channel I/O circuit boards or other subsystems 55a-55h (generally 55 and each sometimes referred to as an "I/O board" or a "daughterboard") respectively associated with and providing the data input/output functionality for the I/O channels C1-C8. The front wall 52a includes or defines a plurality of slots S1-S8 that are adapted to releasably receive and retain the respective I/O channels C1-C8 are further described below. The slots S1-S8 can be physically separate from each other or defined as respective portions of a single open slot.

The primary board 54 is operably connected to the module connector 28 so that the components of the primary board 54 can be selectively operably coupled to the backplane B through a backplane connector 30 (FIGS. 1 & 2) with which the module connector 28 is mated. As described in more detail below with reference to FIGS. 5 and 6, each of the I/O boards 55 is selectively releasably installed in a respective slot S1-S8 and operably physically and electrically coupled to the primary board 54 for communication of power and single channel I/O data between the primary board 54 and the installed I/O board 55. The primary board 54 includes all electronic devices and circuitry 54e required for communication of power and data to/from the backplane B through the module connector 28, and the electronic circuitry of the primary board 54 is thus shared by all of the single channel I/O boards 55 connected to the primary board 54. Each single channel I/O circuit board 55, on the other hand, includes electronic devices and circuitry 55e dedicated to a particular I/O function and a particular type of I/O data, e.g., AC digital input, AC digital output, DC digital input, DC digital output, analog input, analog RTD or thermocouple, analog output, Highway Addressable Remote Transducer (HART) input or output modules, or any other specific type of dedicated I/O circuitry associated only with one of the I/O channels C1-C8. In particular, each I/O circuit board 55 comprises electronic circuitry such as A/D converters, D/A converters, multiplexers, buffers, counters, controllers, serializers, timers, I/O logic, memory, and/or like electronic devices such that the I/O circuit 55e: (i) connects via field connections 24 with the controlled system(s) 26; (ii) converts digital data received from the industrial controller 100 via network adapter 12 into analog or digital output signals for input to the controlled devices 26 or other parts of the controlled system; and/or, (iii) receives digital or analog signals from the controlled field devices 26 or elsewhere and converts the received signals to digital data suitable for transmission to the industrial controller 100 via network adapter 12.

The I/O circuit board 55 of each I/O channel C1-C8 further comprises an interface connector IX including electrical interface contacts IC. Each I/O channel C1-C8 further comprises a respective wiring connector WX1-WX8 (generally WX) that is releasably connected to the interface connector IX of the respective I/O circuit board 55a-55h. Each wiring connector WX includes one or more wire terminals T for operative connection of the I/O field lines 24 that are connected to the field devices or processes 26. As shown herein, each wiring connector WX comprises four wire terminals T, but more or fewer wire terminals T can be provided.

Each wiring connector WX is selectively connectable and removable from the respective single channel I/O circuit board 55. More particularly, each wiring connector WX comprises wiring connector contacts WC (FIGS. 4 & 4A) that selectively mate with the interface contacts IC of an I/O board interface connector IX. The wiring connector WX mechanically engages with a respective one of the I/O board interface connectors IX such that the connector contacts WC operably mate with the interface contacts IC to allow power and I/O data to flow between the single channel I/O circuit board 55 and one or more of the of the field devices/processes 26 via wire terminals T and field lines 24 using the single I/O channel C1-C8 provided by the I/O circuit board 55.

Figure 4A:
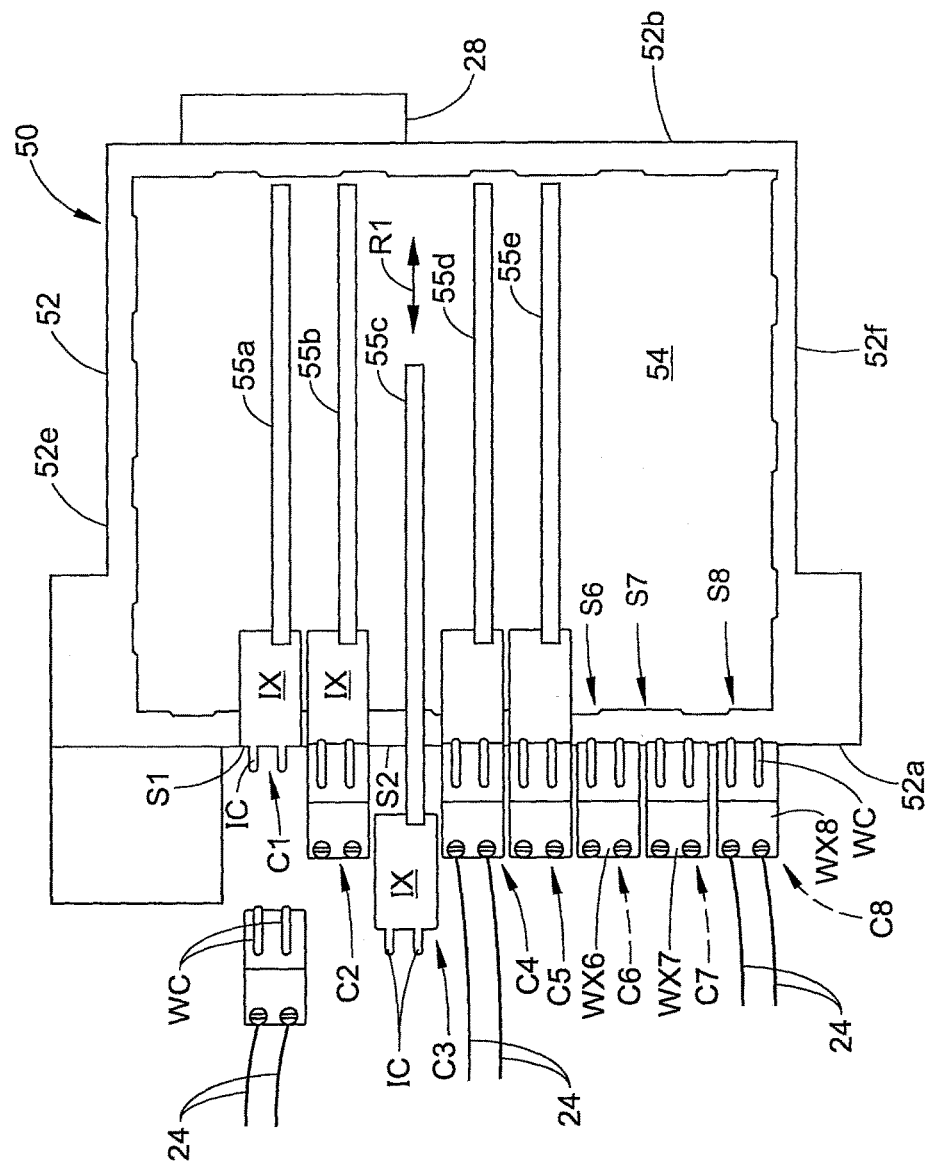
FIG. 4A is similar to FIG. 4 but shows a different configuration in which certain components have been removed or separated.

FIG. 4A is similar to FIG. 4 but shows a different configuration in which certain components have been removed or separated. Each of the wiring connectors WX is selectively releasably connected to said body 52 in alignment and association with one of the plurality of slots S1-S8. In FIG. 4A, it can be seen that the wiring connectors WX6-WX8 are selectively connectable to the body in respective association and alignment with I/O channel slots S6-S8 even if the slot is otherwise empty, i.e., even if the I/O channel slots do not include an installed I/O circuit board 55 as is the case in FIG. 4A for slots S6-S8. In particular, whether or not an I/O circuit board 55 is installed in a slot S1-S8, a wiring connector WX is received and retained in its respective slot S1-S8 and engages the body 52 with a snap-fit or other releasable engagement. If an I/O circuit board 55 is fully installed in a slot S1-S8, as is the case for slots S1, S2, S4, S5 of FIG. 4A, the wiring connector WX will mate with and engage the interface connector IX of the respective I/O circuit board 55 when the wiring connector WX is installed in its slot S1-S8 such that the respective contacts WC,IC operably mate. Each individual wiring connector WX can also be selectively removed from its slot S1-S8 with or without removing the corresponding associated I/O circuit board 55 from the same slot S1-S8 and this can facilitate making wiring connections with the wiring connector WX even before the I/O module 50 is present or installed, i.e., the field lines 24 can be connected to a wiring connector WX in advance of the I/O module 50 being present or installed.

Figure 2:
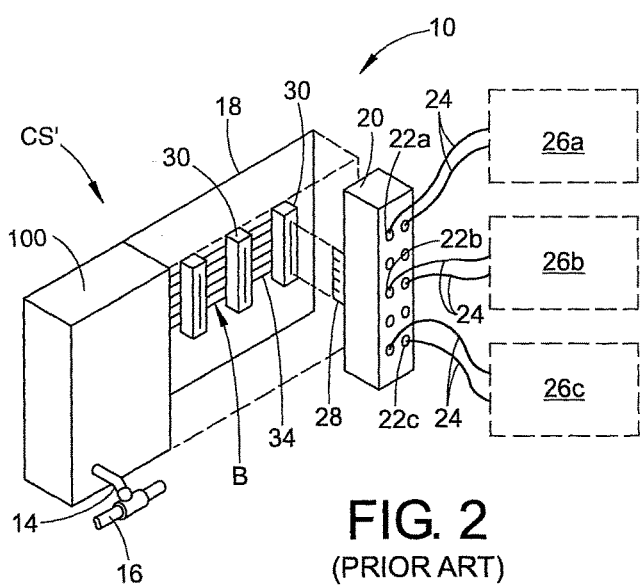
FIG. 2 shows a second example of a known industrial control system in which the industrial automation controller and input/output (I/O) system are provided in an integral unit.

Those of ordinary skill in the art will recognize that the above-described features provide an I/O module that is much easier to install, configure, reconfigure, and repair relative to known I/O modules such as the I/O modules 20 described in FIGS. 1 and 2. In particular, the ability to physically and electrically separate the wiring connector WX from a respective one of the I/O circuit boards 55 allows the field lines 24 to be configured and connected between the field device/process 26 and to the wiring connector WX in advance, before the I/O module 50 and/or before the single channel I/O circuit board 55 is selected and/or installed or available, which greatly simplifies the installation process. Once the I/O module is installed and the appropriate single channel I/O circuit board 55 is installed in its intended slot S1-S8, the wiring connector WX including the field lines 24 already connected to the terminals T thereof is then operatively installed in the corresponding slot S1-S8 so that the wiring connector contacts WC mechanically and electrically mate with the board interface contacts IC. Of course, any individual I/O circuit board 55 can be repaired, replaced and/or reconfigured by a reverse process in which the wiring connector WX is separated from its slot S1-S8 so that the wiring connector contacts WC disconnect from the board interface contacts IC without the need for separating the field lines 24 from the wiring connector terminals T. The I/O circuit board 55 can then be removed from its slot S1-S8 (see arrow R1) and replaced with the same, repaired circuit board or another I/O circuit board 55 having the same or a different configuration, all without powering-down the I/O module. In any such repair or reconfiguration process, the field lines 24, wiring connectors WX and I/O circuit boards 55 associated with and connected to all other I/O channels C1-C8 of the module 50 are unaffected and need not be disconnected.

Figure 5:
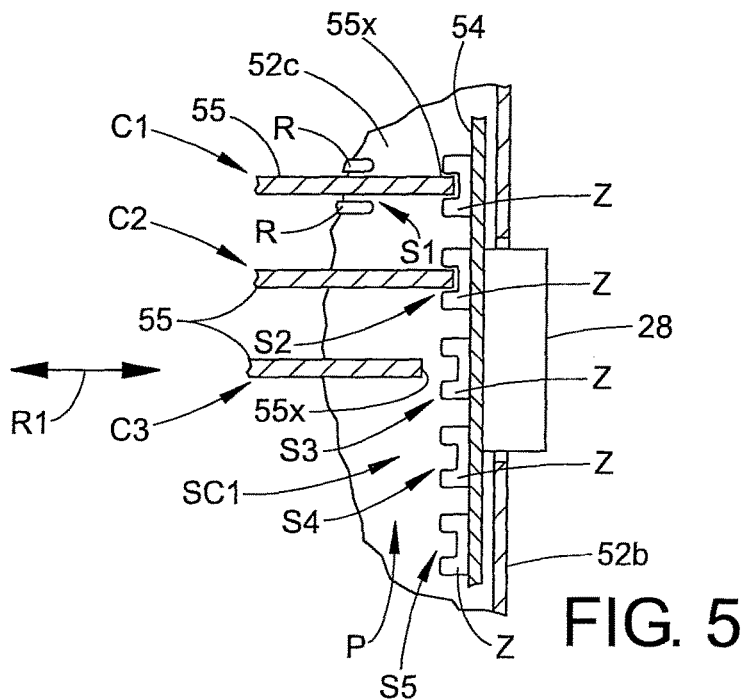
FIG. 5 is a partial side view of the I/O module of FIG. 3 showing a first embodiment of an I/O channel modular sub-chassis for insertion and removal of individual I/O channel circuit subsystems.

FIG. 5 is a partial side view of the I/O module of FIG. 3 showing a first embodiment of an I/O channel modular sub-chassis SC1 for insertion and removal of the individual I/O channel circuit subsystems or boards 55. In the example of FIG. 5, at least part of the primary circuit board 54 is located adjacent the module rear wall 52b and electrically connected to the module connector 28. The primary circuit board 54 comprises a plurality of I/O board connectors Z respectively associated with the I/O channels C1-C8 and in respective alignment with the slots S1-S8. In addition to the I/O board connectors Z, the modular sub-chassis further comprises ribs R defined in the left and right body side walls 52c,52d, and parallel pairs of the ribs R partially define the slots S1-S8 there between in alignment with the respective I/O board connectors Z (to simplify the drawing, only one pair of ribs R partially defining the slot S1 is shown in FIG. 5, but each slot S1-S8 includes similar ribs R defined in both the left and right body side walls 52c,52d). As such, the modular sub-chassis SC1 comprises the primary circuit board 54 including the I/O board connectors Z, and further comprises the corresponding slots S1-S8 defined at least partially by the ribs R. When an I/O circuit board 55 is fully inserted into its slot S1-S8, the corresponding I/O board connector Z mechanically received and retains the I/O circuit board 55, and power and data contacts 55X of the circuit board 55 electrically mate with corresponding contacts in the board connector Z for communication of power and data between the I/O board 55 and the primary board 54 and connector 28.

Figure 6:
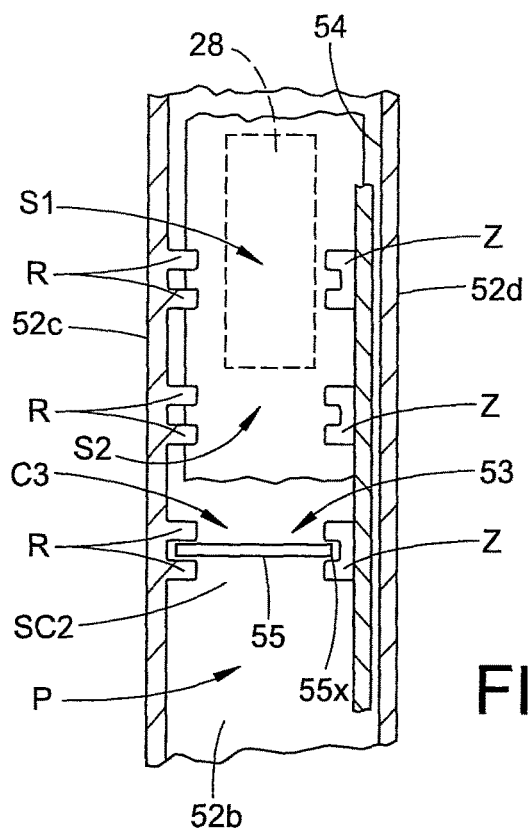
FIG. 6 is a partial side view of the I/O module of FIG. 3 showing a second embodiment of an I/O channel modular sub-chassis for insertion and removal of individual I/O channel circuit subsystems.

FIG. 6 is a partial side view of the I/O module of FIG. 3 showing a second embodiment of an I/O channel modular sub-chassis SC2 for insertion and removal of individual I/O channel circuit subsystems/boards 55. In the example of FIG. 6, at least part of the primary circuit board 54 is located adjacent the module right side wall 52d (and/or alternatively the left side wall 52c) and is electrically connected to the module connector 28. The primary circuit board 54 comprises a plurality of I/O board connectors Z respectively associated with the I/O channels C1-C8 and in respective alignment with the slots S1-S8. In addition to the I/O board connectors Z, the modular sub-chassis SC2 further comprises ribs R defined in the side wall 52c opposite the I/O board connectors Z, and parallel pairs of the ribs R partially define the slots S1-S8 there between. As such, the modular sub-chassis SC2 comprises the primary circuit board 54 including the I/O board connectors Z, and further comprises the corresponding slots S1-S8 defined at least partially by the ribs R. When an I/O circuit board 55 is inserted into its slot S1-S8, the corresponding I/O board connector Z mechanically received and retains one of the lateral edges of the I/O circuit board 55, and power and data contacts 55X of the circuit board 55 electrically mate with corresponding contacts in the board connector Z for communication of power and data between the I/O board 55 and the primary board 54 and connector 28.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. An industrial automation input/output (I/O) module comprising:
   a body defining an internal space including a plurality of slots;
   a module backplane connector connected to said body;
   a primary backplane interface circuit board located in said space of said body, said primary backplane interface circuit board electrically connected to said module backplane connector and comprising electronic devices configured to transmit data and power to and from an associated backplane circuit through said module backplane connector;
   a plurality of individual I/O circuit boards installed respectively in said plurality of slots of said body, each of said I/O circuit boards comprising electronic devices configured to provide a single-channel I/O circuit for input or output of data with respect to an associated field device, wherein:
   each of said I/O circuit boards is electrically connected to said primary backplane interface circuit board when installed in a respective one of said slots; and,
   each of said plurality of I/O circuit boards is selectively removable from its respective slot and from said internal space of said body for selective electrical disconnection of said I/O circuit board from said primary backplane interface circuit board.

2. The industrial automation input/output (I/O) module as set forth in claim 1, wherein said body comprises a front wall through which each of said slots opens.

3. The industrial automation input/output (I/O) module as set forth in claim 1, further comprising a plurality of wiring connectors respectively removably engaged with the plurality of I/O circuit boards, each of said wiring connectors comprising at least one wiring terminal adapted to be electrically connected to a field line of an associated I/O field device.

4. The industrial automation input/output (I/O) module as set forth in claim 3, wherein each of said wiring connectors is selectively releasably connected to said body in alignment and association with one of said plurality of slots.

5. The industrial automation input/output (I/O) module as set forth in claim 3, wherein:
   each of said I/O circuit boards comprises an interface connector comprising interface contacts;
   each of said wiring connectors is engaged with one of said interface connectors;
   each of said wiring connectors comprises wiring connector contacts; and,
   said wiring connector contacts of each wiring connector are mechanically and electrically engaged with the interface contacts of the interface connector with which said wiring connector is engaged.

6. The industrial automation input/output (I/O) module as set forth in claim 5, wherein each of said I/O circuit boards further comprises power and data contacts, said I/O module further comprising:
   a plurality of I/O board connectors each connected to said primary backplane interface circuit board in respective alignment with said slots and each respectively releasably electrically engaged with said power and data contacts of said plurality of I/O circuit boards.

7. The industrial automation input/output (I/O) module as set forth in claim 6, wherein each of said slots is partially defined by a pair of ribs connected to said body in alignment with one of said I/O board connectors.

8. The industrial automation input/output (I/O) module as set forth in claim 7, wherein said body further comprises a rear wall located opposite a front wall, and comprises opposite spaced-apart left and right side walls that extend between and connect said front and rear walls, said primary backplane interface circuit board located adjacent said rear wall and said ribs connected to at least one of said left and right side walls.

9. The industrial automation input/output (I/O) module as set forth in claim 7, wherein said body further comprises a rear wall located opposite a front wall, and comprises opposite spaced-apart left and right side walls that extend between and connect said front and rear walls, said primary backplane interface circuit board located adjacent one of said left and right side walls, wherein said ribs are connected to the other one of said left and right side walls.

10. The industrial automation input/output (I/O) module as set forth in claim 5, wherein each of said I/O circuit boards comprises at least one of: an AC digital input circuit, an AC digital output circuit, a DC digital input circuit, a DC digital output circuit, an analog input circuit, an analog RTD circuit; a thermocouple circuit, an analog output circuit, a Highway Addressable Remote Transducer (HART) circuit.

11. An industrial automation control system comprising:
   an industrial automation controller and a plurality of input/output (I/O) modules operatively connected to the industrial automation controller through an industrial data network, wherein said I/O modules are operatively connected to a chassis comprising a backplane circuit and comprise:
   a body defining an internal space including a plurality of slots;
   a module backplane connector connected to said body for operative electrical connection with said backplane circuit;
   a primary backplane interface circuit board located in said space of said body, said primary backplane interface circuit board electrically connected to said module backplane connector and comprising electronic devices configured to transmit data and power to and from the backplane circuit through said module backplane connector;
   a plurality of individual single-channel I/O circuit boards installed respectively in said plurality of slots of said body, each of said I/O circuit boards comprising electronic devices configured to provide a single-channel I/O circuit for input or output of data with respect to an associated field device or process, wherein:

each of said single-channel I/O circuit boards is operatively electrically connected to said primary backplane interface circuit board when installed in a respective one of said slots; and, each of said plurality of I/O circuit boards is selectively removable from its respective slot and from said internal space of said body for selective electrical disconnection of said I/O circuit board from said primary backplane interface circuit board.

12. The industrial automation control system as set forth in claim 11, wherein said body comprises a front wall through which each of said slots opens.

13. The industrial automation control system as set forth in claim 11, further comprising a plurality of wiring connectors respectively removably engaged with the plurality of single-channel I/O circuit boards, each of said wiring connectors comprising at least one wiring terminal adapted to be electrically connected to a field line of an associated I/O field device.

14. The industrial automation control system as set forth in claim 13, wherein each of said wiring connectors is selectively releasably connected to said body in alignment and association with one of said plurality of slots, wherein each of said wiring connectors is connectable to said body independently of said single-channel I/O circuit boards.

15. The industrial automation control system as set forth in claim 13, wherein:
each of said single-channel I/O circuit boards comprises an interface connector comprising interface contacts;
each of said wiring connectors is engaged with one of said interface connectors;
each of said wiring connectors comprises wiring connector contacts; and,
said wiring connector contacts of each wiring connector are mechanically and electrically engaged with the interface contacts of the interface connector with which said wiring connector is engaged.

16. The industrial automation control system as set forth in claim 15, wherein each of said single-channel I/O circuit boards further comprises power and data contacts, each of said I/O modules further comprising:
a plurality of I/O board connectors each connected to said primary backplane interface circuit board in respective alignment with said slots and each respectively releasably electrically engaged with said power and data contacts of said plurality of I/O circuit boards.

17. The industrial automation control system as set forth in claim 16, wherein each of said slots is partially defined by a pair of ribs connected to said body in alignment with one of said I/O board connectors.

18. The industrial automation control system as set forth in claim 17, wherein said body further comprises a rear wall located opposite a front wall, and comprises opposite spaced-apart left and right side walls that extend between and connect said front and rear walls, said primary backplane interface circuit board located adjacent said rear wall and said ribs connected to at least one of said left and right side walls.

19. The industrial automation control system as set forth in claim 17, wherein said body further comprises a rear wall located opposite a front wall, and comprises opposite spaced-apart left and right side walls that extend between and connect said front and rear walls, said primary backplane interface circuit board located adjacent one of said left and right side walls, wherein said ribs are connected to the other one of said left and right side walls.

20. The industrial automation control system as set forth in claim 15, wherein each of said I/O circuit boards comprises at least one of: an AC digital input circuit, an AC digital output circuit, a DC digital input circuit, a DC digital output circuit, an analog input circuit, an analog RTD circuit; a thermocouple circuit, an analog output circuit, a Highway Addressable Remote Transducer (HART) circuit.

* * * * *